(12) United States Patent
Iino et al.

(10) Patent No.: US 12,036,585 B2
(45) Date of Patent: Jul. 16, 2024

(54) SUBSTRATE PROCESSING APPARATUS

(71) Applicant: Tokyo Electron Limited, Tokyo (JP)

(72) Inventors: Tadashi Iino, Koshi (JP); Yoshiteru Fukuda, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 654 days.

(21) Appl. No.: 17/158,354

(22) Filed: Jan. 26, 2021

(65) Prior Publication Data

US 2021/0229135 A1 Jul. 29, 2021

(30) Foreign Application Priority Data

Jan. 27, 2020 (JP) .................... 2020-011119

(51) Int. Cl.
*H01L 21/67* (2006.01)
*B08B 6/00* (2006.01)

(52) U.S. Cl.
CPC .............. *B08B 6/00* (2013.01); *H01L 21/67* (2013.01)

(58) Field of Classification Search
CPC . H01L 21/67; H01L 27/146; H01L 27/14687; B08B 6/00
See application file for complete search history.

(56) References Cited

U.S. PATENT DOCUMENTS

| 11,600,509 | B2* | 3/2023 | Yen ................... H01L 21/67144 |
| 11,712,710 | B2* | 8/2023 | Kamimura .............. B05B 14/30 |
| | | | 239/125 |
| 11,715,648 | B2* | 8/2023 | Nakata .............. H01L 21/02101 |
| | | | 134/95.2 |
| 2019/0348315 | A1* | 11/2019 | Tanikawa .................. B08B 5/02 |
| 2020/0384509 | A1* | 12/2020 | Azaria .................. B08B 7/0028 |
| 2021/0259087 | A1* | 8/2021 | Ramachandran ........................... |
| | | | H01L 21/67201 |

FOREIGN PATENT DOCUMENTS

| JP | 2005-072374 A1 | 3/2005 |
| JP | 2010161319 A * | 7/2010 |

* cited by examiner

*Primary Examiner* — Michael D Jennings
(74) *Attorney, Agent, or Firm* — Pearne & Gordon LLP

(57) ABSTRACT

A substrate processing apparatus includes an air supply configured to supply air into a place where a substrate is located; and a rectifying member, having multiple through holes, configured to rectify the air supplied from the air supply. The rectifying member includes a base; and a charge diffusion layer formed on a surface of the base. Electric charges attached to a surface of the rectifying member are diffused along the charge diffusion layer.

16 Claims, 14 Drawing Sheets

SUBSTRATE PROCESSING APPARATUS

CROSS-REFERENCE TO RELATED APPLICATION

This application claims the benefit of Japanese Patent Application No. 2020-011119 filed on Jan. 27, 2020, the entire disclosure of which is incorporated herein by reference.

TECHNICAL FIELD

The various aspects and embodiments described herein pertain generally to a substrate processing apparatus.

BACKGROUND

In a substrate processing apparatus such as a single wafer type cleaning apparatus, a fan filter unit is provided at a ceiling of a chamber, and a rectifying plate is disposed between the fan filter unit and a substrate holding device configured to hold the substrate. The rectifying plate is configured to rectify an air flow supplied from the fan filter unit.

Patent Document 1: Japanese Patent Laid-open Publication No. 2005-072374

SUMMARY

In one exemplary embodiment, a substrate processing apparatus includes an air supply configured to supply air into a place where a substrate is located; and a rectifying member, having multiple through holes, configured to rectify the air supplied from the air supply. The rectifying member includes a base; and a charge diffusion layer formed on a surface of the base. Electric charges attached to a surface of the rectifying member are diffused along the charge diffusion layer.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
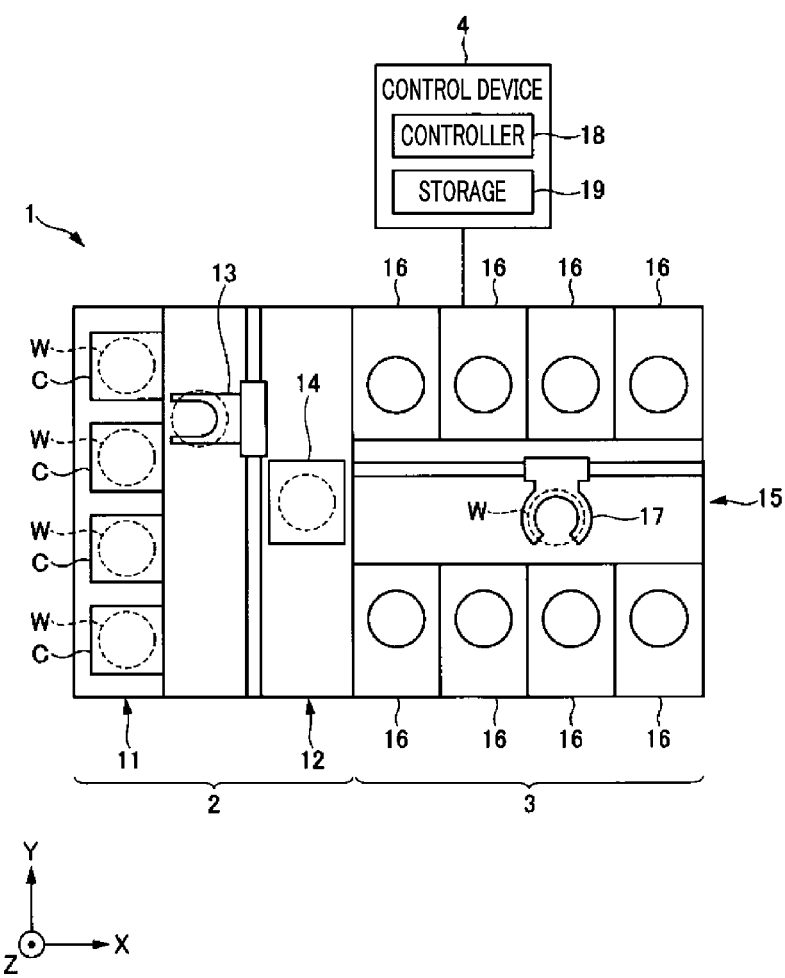
FIG. 1 is a diagram illustrating a schematic configuration of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the various drawings, same or corresponding parts will be assigned same reference numerals, and redundant description will be omitted.

<Configuration of Substrate Processing System>

First, a configuration of a substrate processing system according to an exemplary embodiment will be explained. FIG. 1 is a diagram illustrating a schematic configuration of a substrate processing system according to the exemplary embodiment. In the following, in order to clarity positional relationship, the X-axis, the Y-axis and the Z-axis which are orthogonal to each other will be defined, and the positive Z-axis direction will be regarded as a vertically upward direction.

As depicted in FIG. 1, a substrate processing system 1 includes a carry-in/out station 2 and a processing station 3.

The carry-in/out station 2 and the processing station 3 are provided adjacent to each other.

The carry-in/out station 2 is provided with a carrier placing section 11 and a transfer section 12. A plurality of carriers C each of which accommodates a plurality of wafers W therein in a horizontal posture is provided in the carrier placing section 11.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of etching units 16. These etching units 16 are arranged at both sides of the transfer section 15. Further, the number of the etching units 16 is not limited to the example shown in FIG. 1.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the etching units 16 by using the wafer holding mechanism.

The etching unit 16 is configured to perform a predetermined substrate processing on the wafers W transferred by the substrate transfer device 17.

Further, the substrate processing system 1 is equipped with a control device 4. The control device 4 includes a controller 18 and a storage 19.

The controller 18 includes various circuits and a microcomputer having, for example, a CPU (Central Processing unit), a ROM (Read Only Memory), a RAM (Random Access Memory), an input/output port, and so forth. The CPU executes a program stored in the ROM by using the RAM as a working area, whereby the controller 18 controls an operation of the substrate processing system 1.

Further, the program may be recorded in a computer-readable recording medium, and installed from the recording medium to the storage 19 of the control device 4. The computer-readable recording medium may be, for example, a hard disc (HD), a flexible disc (FD), a compact disc (CD), a magneto optical disc (MO), or a memory card.

The storage 19 is implemented by, by way of non-limiting example, a semiconductor memory device such as a RAM or a flash memory, or a storage device such as a hard disk or an optical disk.

<Configuration of Etching Unit>

Figure 2:
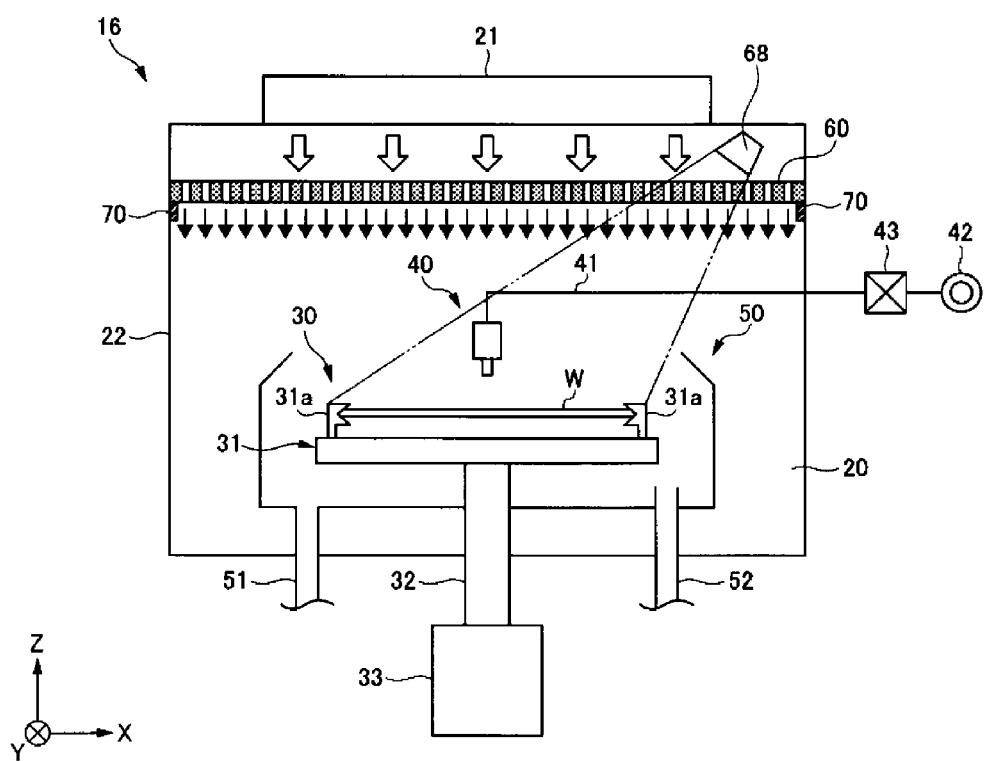
FIG. 2 is a diagram illustrating a schematic configuration of an etching unit.

Now, a configuration of the etching unit 16 will be explained. FIG. 2 is a diagram illustrating a schematic configuration of the etching unit 16.

As depicted in FIG. 2, the etching unit 16 includes a chamber 20, a substrate holding mechanism 30, a supply 40, and a recovery cup 50.

The chamber 20 accommodates therein the substrate holding mechanism 30, the supply 40, and the recovery cup 50. By way of example, the chamber 20 is grounded. A FFU (Fan Filter Unit) 21 is provided at a ceiling of the chamber 20. The FFU 21 creates a downflow within the chamber 20. The chamber 20 is an example of a housing, and the FFU 21 is an example of an air supply.

The substrate holding mechanism 30 is equipped with a holder 31, a supporting column 32, and a driving unit 33. The holder 31 holds the wafer W horizontally. The wafer W is held by the holder 31 with a surface thereof having an etching target film formed thereon facing upwards.

In the present exemplary embodiment, the holder 31 has a plurality of grippers 31a and holds the wafer W by gripping a peripheral portion of the wafer W with these grippers 31a. However, the exemplary embodiment is not limited thereto, and the holder 31 may be a vacuum chuck configured to attract and hold the wafer W.

The supporting column 32 is a vertically extending member, and a base end thereof is rotatably supported by the driving unit 33, and a leading end thereof supports the holder 31 horizontally. The driving unit 33 rotates the supporting column 32 around a vertical axis. In this substrate holding mechanism 30, by rotating the supporting column 32 with the driving unit 33, the holder 31 supported by the supporting column 32 is rotated, so that the wafer W held by the holder 31 is rotated.

The supply 40 is disposed above the wafer W held by the holder 31. One end of a supply path 41 is connected to the supply 40, and the other end of the supply path 41 is connected to a source 42 for a processing liquid. A flow rate control valve 43 capable of opening/closing the supply path 41 and adjusting a supply flow rate of the processing liquid is provided in a portion of the supply path 41. If the flow rate control valve 43 is opened, the processing liquid is supplied from the supply 40 onto the wafer W held by the holder 31. Accordingly, the processing liquid is supplied onto the wafer W. The processing liquid includes, by way of example, but not limitation, pure water (DIW), an aqueous solution (SC1 solution) of $NH_4OH$ (ammonium hydroxide) and $H_2O_2$ (hydrogen peroxide), diluted fluoric acid (DHF), isopropyl alcohol (IPA), and so forth. Though one set of the supply 40, the supply path 41, the source 42 and the flow rate control valve 43 is illustrated in FIG. 2, this set of the supply 40, the supply path 41, the source 42 and the flow rate control valve 43 is provided for each processing liquid.

The recovery cup 50 is disposed to surround the holder 31, and collects the processing liquid scattered from the wafer W by the rotation of the holder 31. A drain port 51 is formed at a bottom of the recovery cup 50, and the processing liquid collected by the recovery cup 50 is drained from the drain port 51 to an outside of the etching unit 16. Further, an exhaust port 52 is formed at the bottom of the recovery cup 50 to exhaust the gas supplied from the FFU 21 to the outside of the etching unit 16.

Within the chamber 20, a rectifying plate 60 is provided under the FFU 21. A supporting member 70 configured to support the rectifying plate 60 is fixed to a sidewall 22 of the chamber 20, and the rectifying plate 60 is supported by the supporting member 70. The rectifying plate 60 is an example of a rectifying member.

<Configuration of Rectifying Plate>

Figure 3A:
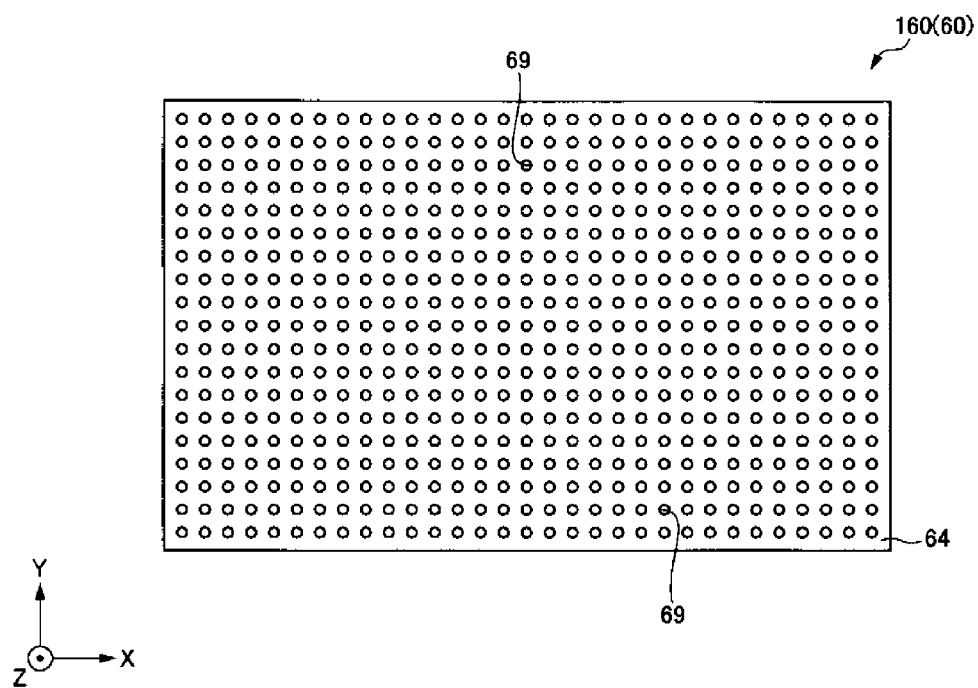
FIG. 3A and FIG. 3B are diagrams illustrating a schematic configuration of a first example of a rectifying plate according to the exemplary embodiment.
Figure 3B:
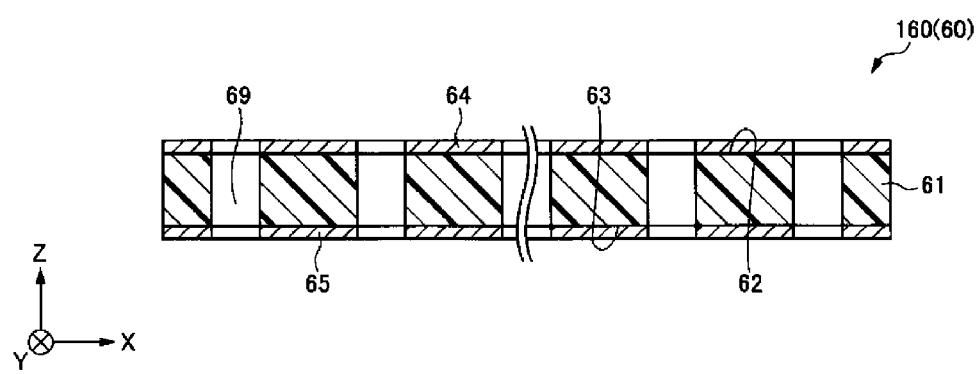

Now, a configuration of the rectifying plate 60 will be discussed. FIG. 3A and FIG. 3B are diagrams illustrating a schematic configuration of an example of the rectifying plate 60. FIG. 3A is a plan view, and FIG. 3B is a cross sectional view.

As depicted in FIG. 3A and FIG. 3B, a rectifying plate 160 as a first example of the rectifying plate 60 is equipped with a plate-shaped base 61, a charge diffusion layer 64, and a charge diffusion layer 65. Byway of example, the base 61 is made of an insulating material. As a specific example, a resin such as polyvinyl chloride (PVC), polypropylene (PP), Polytetrafluoroethylene (PTFE), or polychlorotrifluoroethylene (PCTFE) is used as the material of the base 61. The charge diffusion layer 64 covers a top surface 62 of the base 61, and the charge diffusion layer 65 covers a bottom surface 63 of the base 61. The charge diffusion layers 64 and 65 are made of a conductive material or a static electricity diffusing material. If electric charges adhere to the surfaces of the rectifying plate 60, these electric charges are diffused along the charge diffusion layer 64 or 65. Desirably, the charge diffusion layers 64 and 65 have corrosion resistance against the processing liquid. The conductive material may be, by way of example, a noble metal such as gold, platinum or the like. The static electricity diffusing material may be, by way of example, but not limitation, tin oxide, antimony-doped tin oxide (ATO), tin-doped indium oxide, or the like. The rectifying plate 160 is provided with a multiple number of through holes 69. The through holes 69 are formed through the charge diffusion layer 64, the base 61 and the charge diffusion layer 65. The charge diffusion layers 64 and 65 have a thickness ranging from, e.g., about 0.1 μm to about 0.3 μm. A sheet resistance of the charge diffusion layers 64 and 65 is in a range from, e.g., about $10^5$ Ω/sq to about $10^{11}$ Ω/sq. The through hole 69 has a diameter ranging from, e.g., about 3 mm to about 5 mm.

<Specific Operation of Substrate Processing System>

Figure 4:
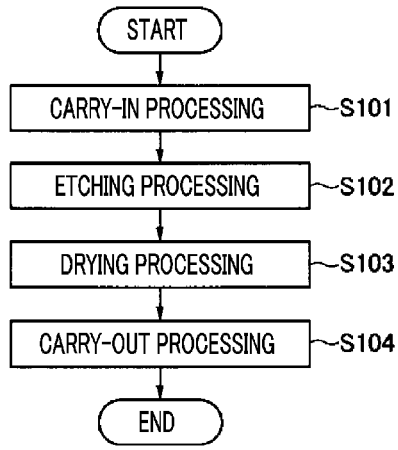
FIG. 4 is a flowchart illustrating a sequence of a substrate processing performed by the substrate processing system.

Now, a specific operation of the substrate processing system 1 will be described. FIG. 4 is a flowchart illustrating a sequence of a substrate processing performed by the substrate processing system 1. The individual apparatuses of the substrate processing system 1 perform the following processing sequence shown in FIG. 4 under the control of the controller 18.

As shown in FIG. 4, in the substrate processing system 1, a carry-in processing of carrying the wafer W into the etching unit 16 is performed (process S101). Specifically, the substrate transfer device 13 of the carry-in/out station 2 takes out the wafer W from the carrier C placed in the carrier placing section 11, and places the taken wafer W in the delivery unit 14. The wafer W placed in the delivery unit 14 is taken out from the delivery unit 14 by the substrate transfer device 17 of the processing station 3, and carried into the etching unit 16. The wafer W carried into the etching unit 16 is held by the holder 31 of the etching unit 16.

Then, an etching processing is performed in the substrate processing system 1 (process S102). In the etching processing, a processing liquid for etching is supplied from the supply 40 onto the wafer W held by the holder 31 while rotating the holder 31 holding the wafer W by the driving unit 33. Further, while rotating the holder 31 holding the wafer W by the driving unit 33, a processing liquid for rinsing is supplied from the supply 40 onto the wafer W held by the holder 31.

Thereafter, a drying processing is performed in the substrate processing system 1 (process S103). In the drying processing, while carrying on the rotation of the wafer W, the supply of the processing liquid for rinsing is stopped. Accordingly, the processing liquid remaining on the wafer W is removed, so that the wafer W is dried.

Subsequently, a carry-out processing is performed in the substrate processing system 1 (process S104). In the carry-out processing, the wafer W after being subjected to the drying processing is carried out of the etching unit 16 by the substrate transfer device 17, and placed in the delivery unit 14. Then, the processed wafer W placed in the delivery unit 14 is returned back into the carrier C in the carrier placing section 11 by the substrate transfer device 13. Then, the substrate processing upon the single sheet of wafer W including the above-described series of processes is ended.

During the substrate processing including the series of processes, the FFU 21 creates a downflow of air within the chamber 20. The rectifying plate 60 causes a pressure loss for the downflow of the air formed by the FFU 21, and serves as a buffer in a positive pressure state. Accordingly, a flow velocity of the downflow is adjusted by the rectifying plate 60.

<Function of Rectifying Plate>

In general, when maintenance of a substrate processing system is performed, a rectifying plate may be separated from a chamber. At this time, the rectifying plate may come into contact with an operator. Further, the separated rectifying plate may be wiped. For these reasons, the rectifying plate may be given static electricity by friction. If the rectifying plate is strongly charged, a foreign substance such as dust may adhere to the rectifying plate. The foreign substance attached to the rectifying plate may be separated from the rectifying plate to fall off it, resulting in contamination of the inside of the chamber. For the reason, after the rectifying plate is installed, it takes time before a stable operation is enabled. That is, it takes time before a degree of cleanness within the chamber reaches a preset degree of cleanness at which the stable operation is enabled.

Figure 5A:
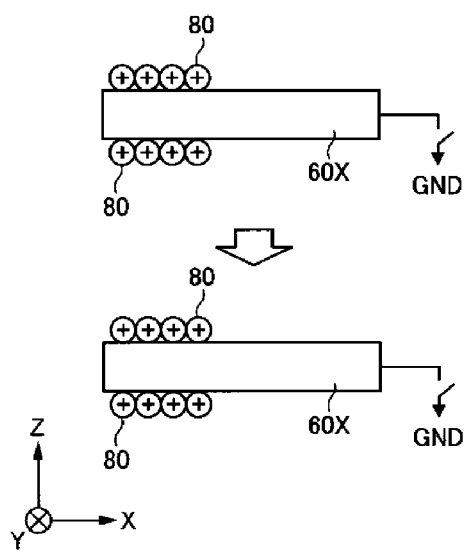
FIG. 5A and FIG. 5B are first diagrams illustrating a distribution of electric charges of a rectifying plate according to a comparative example.
Figure 5B:
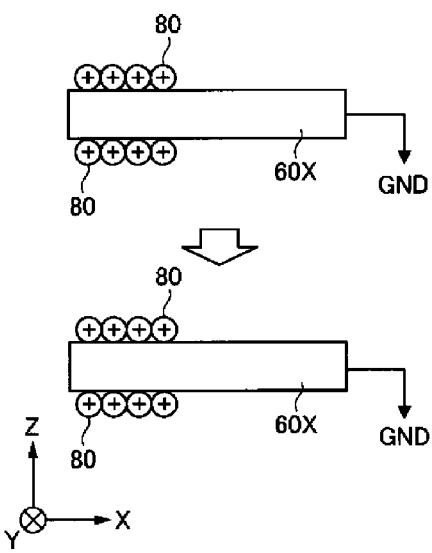
Figure 6A:
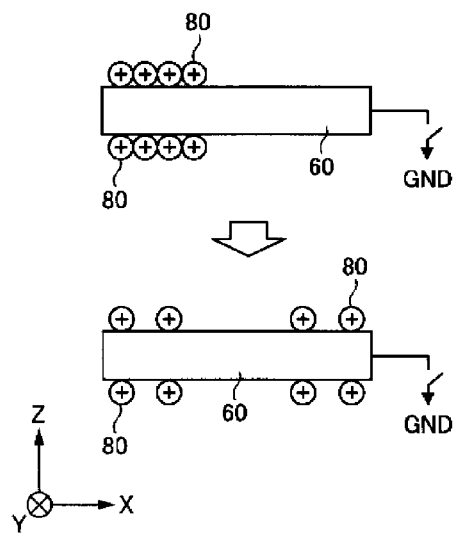
FIG. 6A and FIG. 6B are second diagrams illustrating a distribution of electric charges of the rectifying plate according to the exemplary embodiment.
Figure 6B:
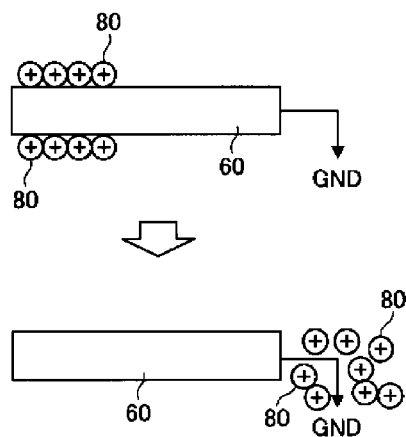

In the present exemplary embodiment, the charge diffusion layers 64 and 65 made of the conductive material or the static electricity diffusing material are provided in the rectifying plate 60. Thus, even if the rectifying plate 60 is charged, an electric field caused by concentration of electric charges can be alleviated, as compared to a rectifying plate which is not provided with the charge diffusion layers 64 and 65. FIG. 5A to FIG. 6B are schematic diagrams illustrating distributions of electric charges of rectifying plates. FIG. 5A shows a variation of a distribution of electric charges in a rectifying plate 60X which is not provided with the charge diffusion layers 64 and 65 and not grounded; and FIG. 5B shows a variation of a distribution of electric charges in the rectifying plate 60X which is not provided with the charge diffusion layers 64 and 65 but grounded. FIG. 6A shows a variation of a distribution of electric charges in the rectifying plate 60 which is in an electrically floating state without being grounded, and FIG. 6B shows a variation of a distribution of electric charges in the rectifying plate 60 which is grounded. Here, the rectifying plate 60X is formed of the insulating base 61.

As depicted in FIG. 5A, in case that electric charges 80 are attached while being concentrated to a certain region of the rectifying plate 60X, the electric charges 80 stay on this certain region even if time elapses. As a result, there is formed a region having a locally high electric potential, and a foreign substance such as dust may easily adhere to this region.

Even if the rectifying plate 60X is grounded, since the rectifying plate 60X is made of the insulating base 61, the electric charges 80 do not move but stay on the region to which they originally have adhered even with a lapse of time, as depicted in FIG. 5B. As a result, there is formed a region having a locally high electric potential, and the foreign substance such as the dust may easily adhere to this region.

Meanwhile, as shown in FIG. 6A, if electric charges 80 are attached while being concentrated to a certain region of the rectifying plate 60, the electric charges 80 are rapidly diffused along the charge diffusion layers 64 and 65. Accordingly, even if the charges 80 are left on the rectifying plate 60 since the charge diffusion layers 64 and 65 are in an electrically floating state, the formation of the region having the locally high electric potential can be suppressed, and the adhesion of the foreign substance such as the dust can be suppressed.

Furthermore, if the rectifying plate 60 is grounded, the electric charges 80 flow to the ground to be removed from the rectifying plate 60, as illustrated in FIG. 6B. Accordingly, the formation of the region having the locally high electric potential can be further suppressed, and the adhesion of the foreign substance such as the dust to the rectifying plate 60 can also be further suppressed.

As stated above, since the rectifying plate 60 is used in the present exemplary embodiment, the formation of the region having the locally high electric potential can be suppressed, and the adhesion of the foreign substance to the rectifying plate 60 can be suppressed. Further, as the adhesion of the foreign substance is suppressed, a time taken before the stable operation is enabled after the rectifying plate 60 is installed can be shortened.

The reason why the rectifying plate gets electrically charged is not limited to the friction in the maintenance. The rectifying plate may be charged due to the adhesion of the processing liquid in the form of mist which is scattered within the chamber during the substrate processing. If the electric potential of the rectifying plate becomes locally high during the substrate processing, the unexpected electric discharge may occur within the chamber, causing an electrostatic breakdown in the film formed on the wafer W or affecting the electric characteristic of the film. In the present exemplary embodiment, however, since the formation of the region having the locally high electric potential can be suppressed, such an electric discharge can be suppressed. That is, stability of operation can be ameliorated.

Moreover, since it becomes difficult for the foreign substance to adhere to the rectifying plate 60, the maintenance work can be simplified.

In addition, in case that the base 61 is made of a visible light-transmissive material such as polyvinylchloride (PVC), an optical sensor 68 (see FIG. 2) may be provided above the rectifying plate 60, and presence or absence of the wafer W may be detected by the optical sensor 68.

Further, the through holes 69 need not be formed to have a constant density. The rectifying plate 60 may include a region having a locally high density of the through holes 69 and a region having a locally low density of the through holes 69. Furthermore, the through holes 69 may not have the same diameter. By adjusting the density and the diameter of the through holes 69, a distribution of a supply amount of the air and a flow velocity thereof can be adjusted.

<Manufacturing Method of Rectifying Plate>

Figure 7A:
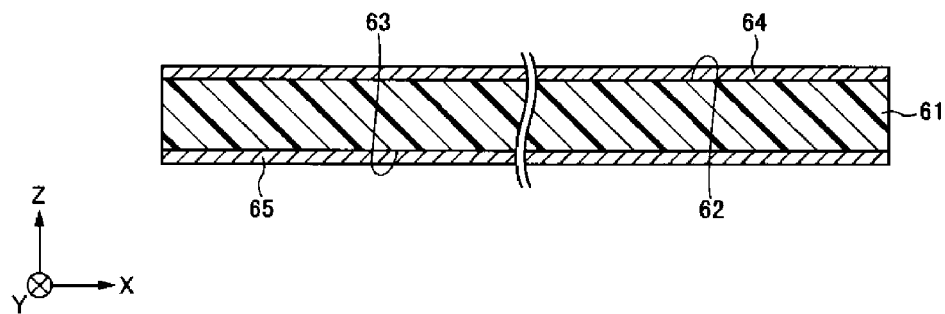
FIG. 7A and FIG. 7B are cross sectional views illustrating a manufacturing method of the rectifying plate according to the first example.
Figure 7B:
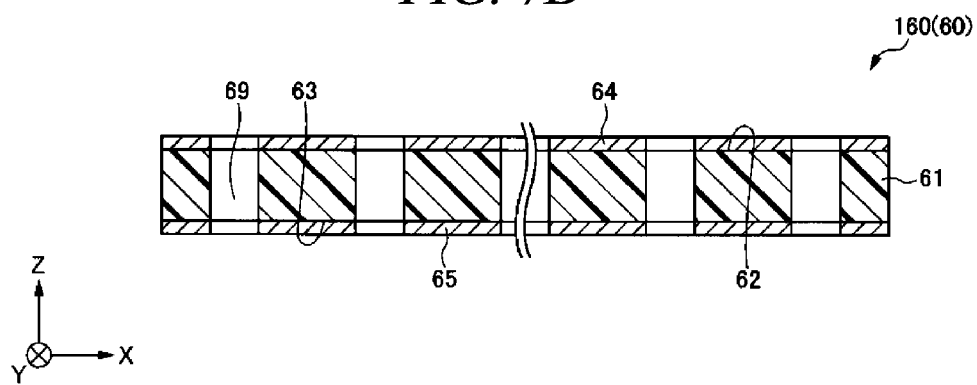

Now, a manufacturing method of the rectifying plate 160 according to the first example shown in FIG. 3A and FIG. 3B will be explained. FIG. 7A and FIG. 7B are cross sectional views illustrating the manufacturing method of the rectifying plate 160 according to the first example.

First, as depicted in FIG. 7A, the base 61 is prepared, and the charge diffusion layer 64 is formed on the top surface 62 of the base 61, and the charge diffusion layer 65 is formed on the bottom surface 63 of the base 61. For example, in the formation of the charge diffusion layers 64 and 65, a paste containing particles of the material forming the charge diffusion layers 64 and 65 is coated, and this paste is sintered. Then, as shown in FIG. 7B, a multiple number of through holes 69 are formed in a complex of the base 61 and the charge diffusion layers 64 and 65. The through holes 69 may be formed by, for example, mechanical machining.

After the formation of the through holes 69, it is desirable to remove a burr generated when the through holes 69 are formed.

Through the method as stated above, the rectifying plate 160 shown in FIG. 3A and FIG. 3B can be manufactured.

<Configurations of Other Examples of Rectifying Plate>

Figure 8A:
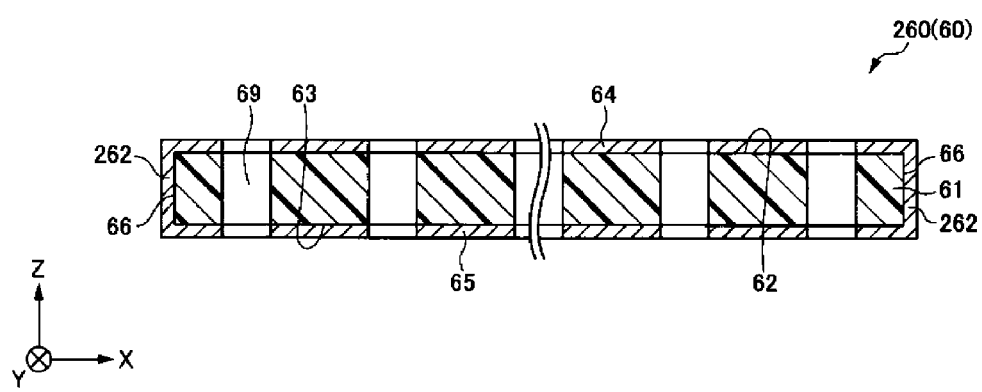
FIG. 8A and FIG. 8B are diagrams illustrating configurations of a second example and a third example of the rectifying plates according to the exemplary embodiment, respectively.
Figure 8B:
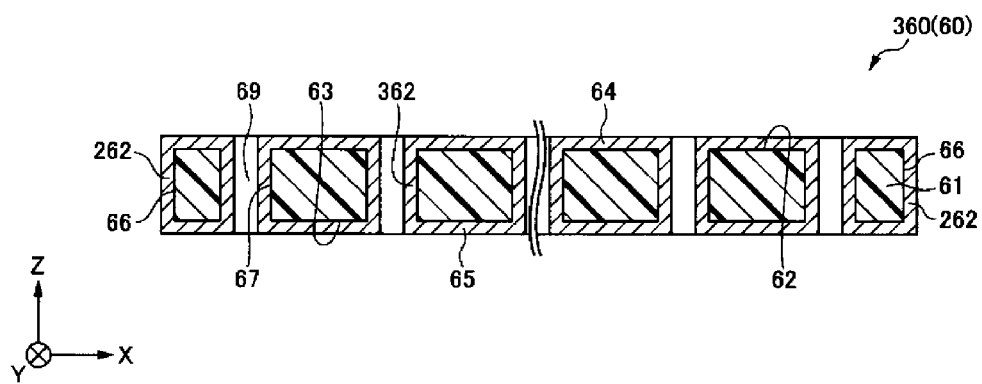

Now, configurations of other examples of the rectifying plate 60 will be described. FIG. 8A and FIG. 8B are diagrams illustrating schematic configurations of the other examples of the rectifying plate 60. FIG. 8A is a cross sectional view illustrating a second example of the rectifying plate 60, and FIG. 8B is a cross sectional view illustrating a third example of the rectifying plate 60.

A rectifying plate 260 as the second example of the rectifying plate 60 has, as illustrated in FIG. 8A, the base 61, the charge diffusion layer 64, the charge diffusion layer 65, and a charge diffusion layer 262. The charge diffusion layer 262 is connected with the charge diffusion layers 64 and 65, and covers side surface 66 of the base 61. Like the charge diffusion layers 64 and 65, the charge diffusion layer 262 is made of the conductive material or the static electricity diffusing material. The charge diffusion layer 262 may have a thickness of, e.g., about 0.1 μm to about 0.3 μm, and a sheet resistance of the charge diffusion layer 262 may be in a range from, e.g., about $10^5$ Ω/sq to about $10^{11}$ Ω/sq.

In the rectifying plate 160, the charge diffusion layer 64 and the charge diffusion layer 65 are insulated from each other. In the rectifying plate 260, however, the charge diffusion layer 64 and the charge diffusion layer 65 are electrically connected with each other via the charge diffusion layer 262. Thus, if one of the charge diffusion layers 64 and 65 is grounded, the other is also grounded.

A rectifying plate 360 as the third example of the rectifying plate 60 includes, as depicted in FIG. 8B, the base 61, the charge diffusion layer 64, the charge diffusion layer 65, the charge diffusion layer 262, and a charge diffusion layer 362. The charge diffusion layer 362 is connected with the charge diffusion layers 64 and 65, and cover inner wall surfaces 67 of the through holes 69. Like the charge diffusion layers 64 and 65, the charge diffusion layer 362 is made of the conductive material or the static electricity diffusing material. The charge diffusion layer 362 may have a thickness of, e.g., about 0.1 μm to about 0.3 μm, and a sheet resistance of the charge diffusion layer 362 may be in a range from, e.g., about $10^5$ Ω/sq to about $10^{11}$ Ω/sq.

In the rectifying plate 360, the charge diffusion layer 64 and the charge diffusion layer 65 are electrically connected with each other through the charge diffusion layers 262 and 362. Therefore, the electric resistance between the charge diffusion layer 64 and the charge diffusion layer 65 can be reduced, as compared to the rectifying plate 260.

<Manufacturing Methods of Other Examples of Rectifying Plate>

Figure 9A:
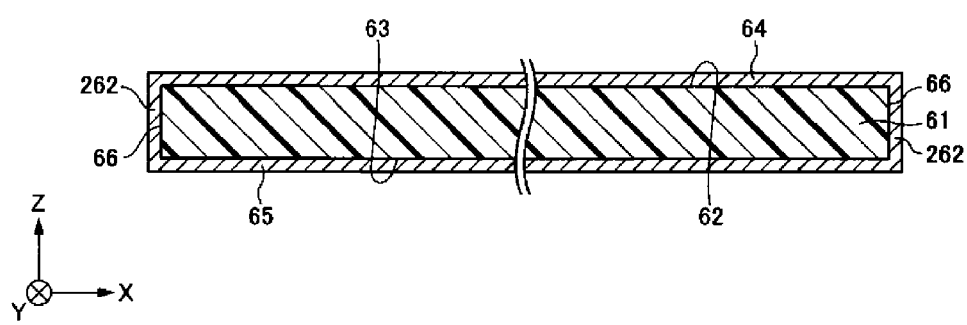
FIG. 9A and FIG. 9B are cross sectional views illustrating a manufacturing method of the rectifying plate according to the second example.
Figure 9B:
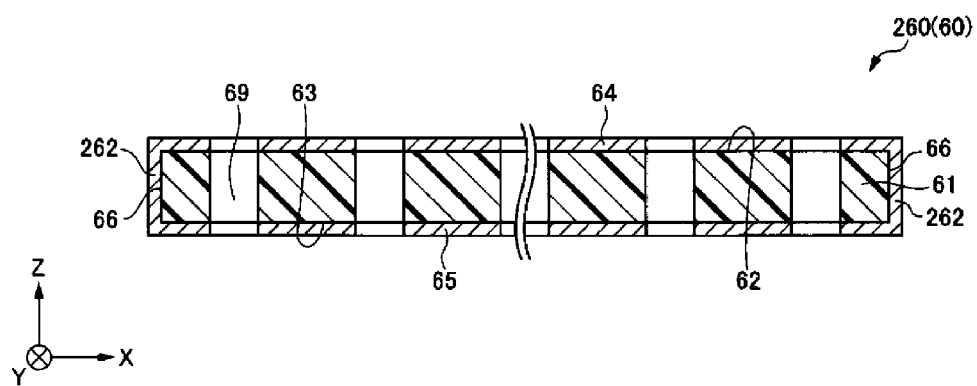
Figure 10A:
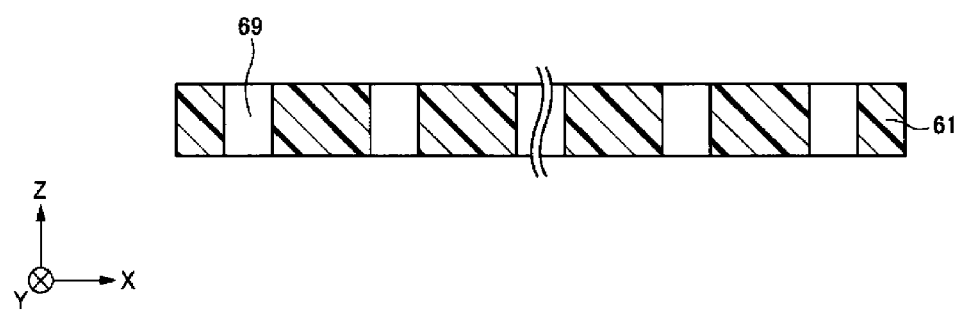
FIG. 10A and FIG. 10B are cross sectional views illustrating a manufacturing method of the rectifying plate according to the third example.
Figure 10B:
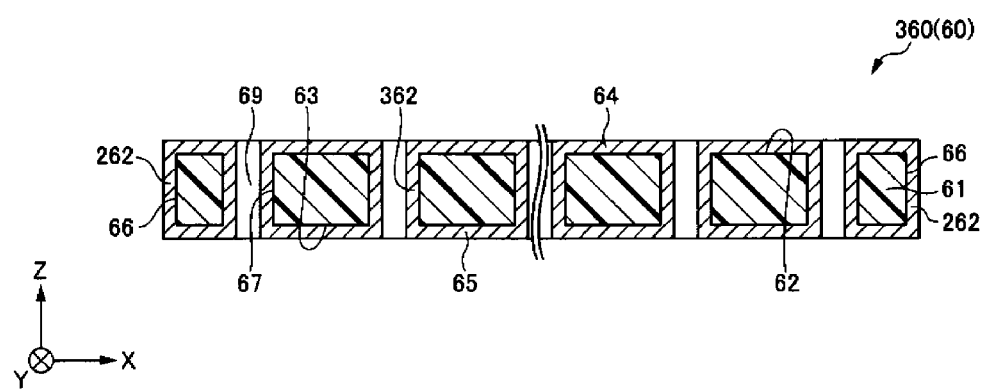

Now, a manufacturing method of the rectifying plate 260 according to the second example shown in FIG. 8A and a manufacturing method of the rectifying plate 360 according to the third example shown in FIG. 8B will be discussed. FIG. 9A and FIG. 9B are cross sectional views illustrating the manufacturing method of the rectifying plate 260 according to the second example. FIG. 10A and FIG. 10B are cross sectional views illustrating the manufacturing method for the rectifying plate 360 according to the third example.

Referring to FIG. 9A, in the manufacturing method of the rectifying plate 260 according to the second example, the base 61 is first prepared, and the charge diffusion layer 64 is formed on the top surface 62 of the base 61; the charge diffusion layer 65 is formed on the bottom surface 63 of the base 61; and the charge diffusion layer 262 is formed on the side surfaces 66 of the base 61. By way of example, in the formation of the charge diffusion layers 64, 65 and 262, the paste containing the material forming the charge diffusion layers 64, 65 and 262 is coated, and this paste is then sintered. Thereafter, as shown in FIG. 9B, the multiple number of through holes 69 are formed in a complex of the base 61 and the charge diffusion layers 64, 65 and 262. The through holes 69 may be formed by, for example, the mechanical machining. After the formation of the through holes 69, it is desirable to remove the burr which is generated when the through holes 69 are formed.

Through the above-described method, the rectifying plate 260 shown in FIG. 8A can be manufactured.

In the manufacturing method of the rectifying plate 360 according to the third example, the base 61 is first prepared, and the multiple number of through holes 69 are formed in the base 61, as illustrated in FIG. 10A. The through holes 69 may be formed by, for example, the mechanical machining. After the formation of the through holes 69, it is desirable to remove the burr which is generated when the through holes 69 are formed. Then, as shown in FIG. 10B, the charge diffusion layer 64 is formed on the top surface of the base 61; the charge diffusion layer 65 is formed on the bottom surface 63 of the base 61; the charge diffusion layer 262 is formed on the side surfaces 66 of the base 61; and a charge diffusion layer 362 is formed on the inner wall surfaces 67 of the through holes 69. In the formation of the charge diffusion layers 64, 65, 262 and 362, the paste containing the material forming the charge diffusion layers 64, 65, 262 and 362 is coated, and this paste is then sintered.

Through the above-stated method, the rectifying plate 360 shown in FIG. 8B can be manufactured.

Figure 11:
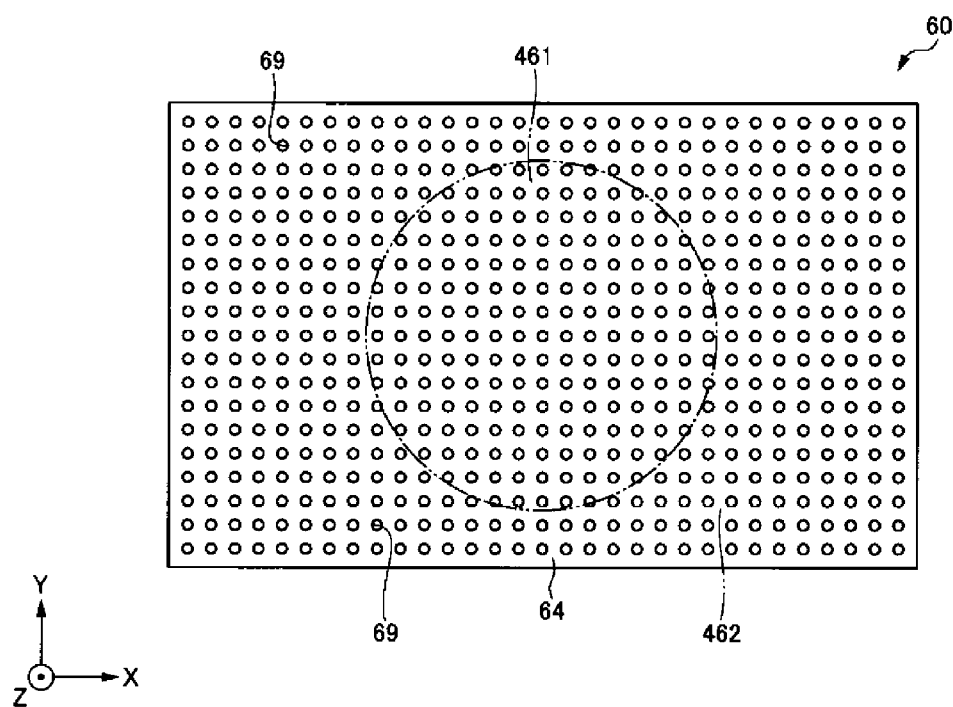
FIG. 11 is a plan view illustrating a schematic configuration of a modification example of the rectifying plate according to the exemplary embodiment.

Further, a charge diffusion function (charge diffusion property) of the charge diffusion layers 64 and 65 may not be uniform within a surface parallel to the top surface 62 and the bottom surface 63. FIG. 11 is a plan view illustrating a schematic configuration of a modification example of the rectifying plate 60.

By way of example, as depicted in FIG. 11, a first charge diffusion property of a central region 461 of the charge diffusion layer 64 (65) which is overlapped with the wafer W when seen from the top may be higher than a second charge diffusion property of a peripheral region 462 around the central region 461. That is, the electric charges may be more easily diffused in the central region 461 than in the peripheral region 462. In this modification example, it is particularly difficult for the static electricity to stay in the central region 461. Accordingly, the fall of the foreign substance onto the wafer W and the electric discharge near the wafer W can be further suppressed. The central region 461 is an example of a first region, and the peripheral region 462 is an example of a second region.

In the manufacture of the rectifying plate 60 according to the present modification example, a content of particles of the material forming the charge diffusion layer 64 (65) in the central region 461 is set to be larger than a content of particles of the material forming the charge diffusion layer 64 (65) in the peripheral region 462, for example.

<Grounding of Rectifying Plate>

Figure 12:
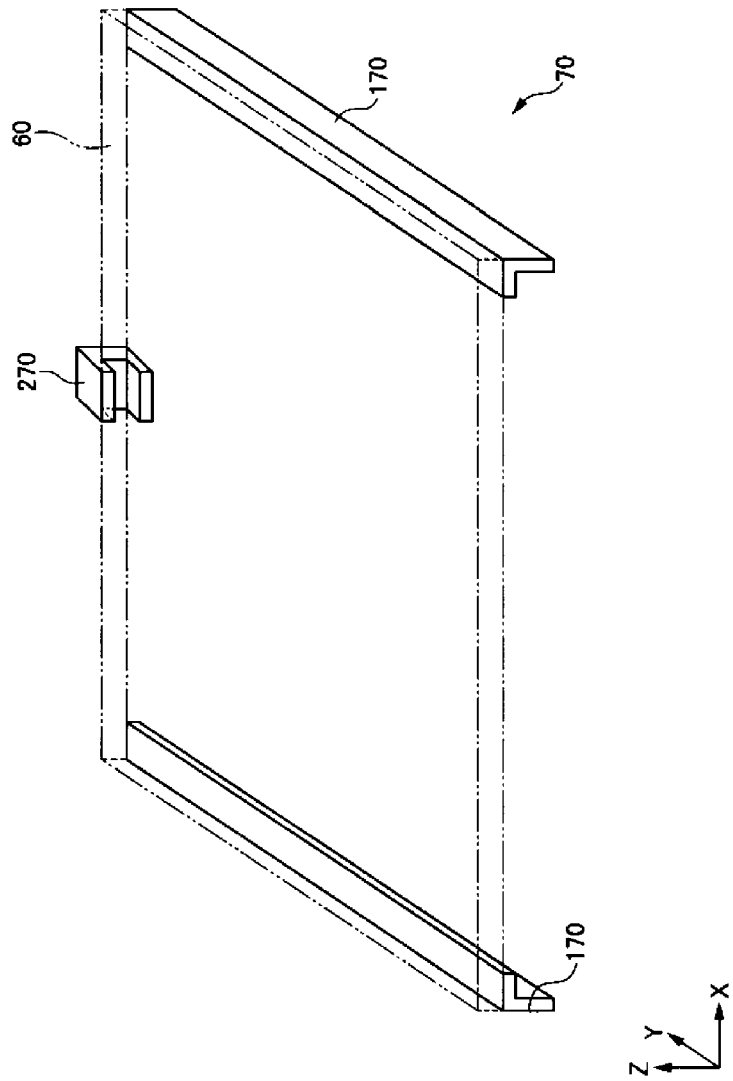
FIG. 12 is a diagram illustrating a schematic configuration of an example supporting member.

As stated above, in case that the charge diffusion layers 64 and 65 of the rectifying plate 60 are grounded, it is easy to suppress the formation of the region having the locally high electric potential by removing the static electricity. Here, a structure for connecting the charge diffusion layers 64 and 65 to the ground will be explained. FIG. 12 is a diagram illustrating a schematic configuration of an example of the supporting member 70.

Figure 13:
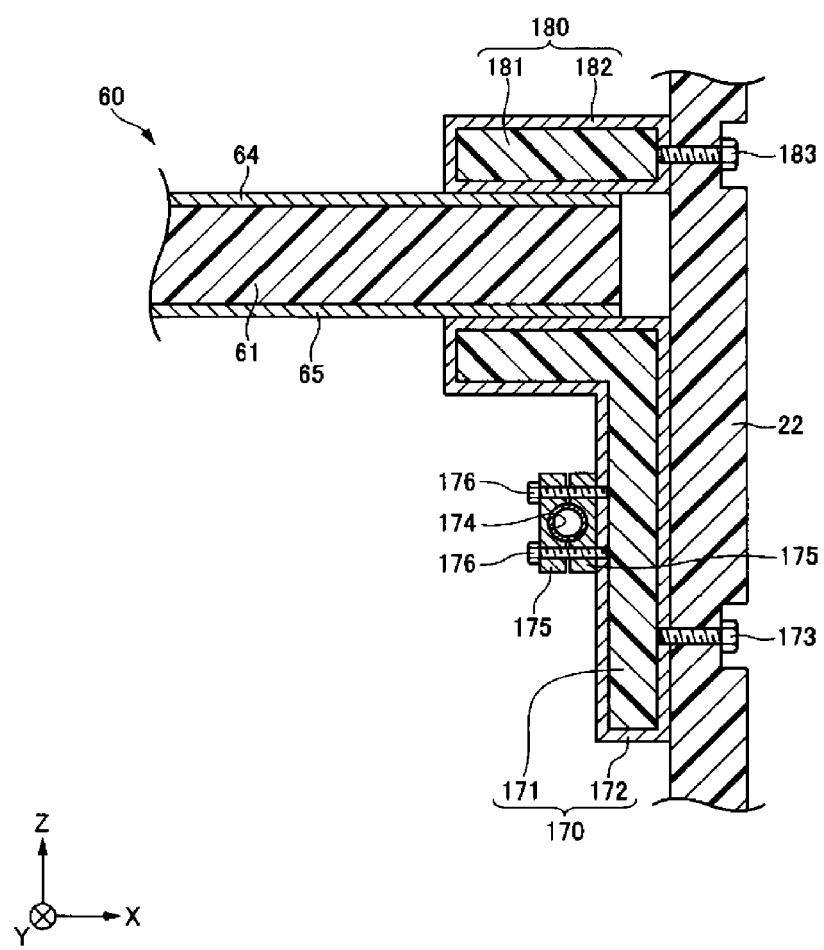
FIG. 13 is a cross sectional view illustrating a schematic configuration of a rail member.
Figure 14:
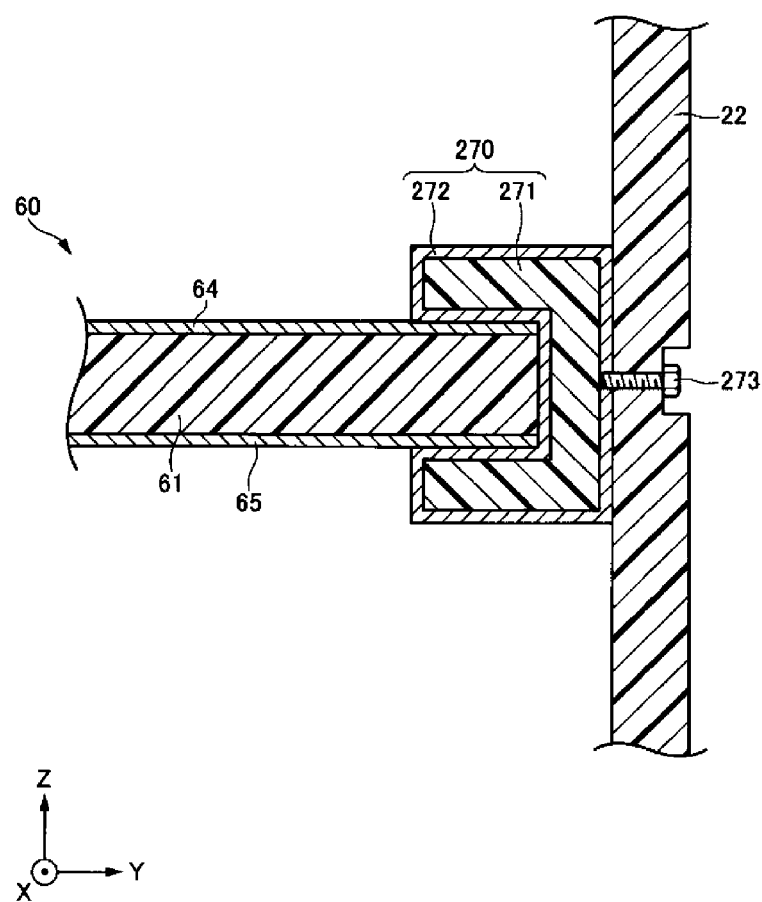
FIG. 14 is a cross sectional view illustrating a schematic configuration of a relay member.

In this example, the rectifying plate 60 is moved toward the positive Y-axis direction when it is installed, and moved toward the negative Y-axis direction when it is separated. That is, the rectifying plate 60 is fitted or separated along the Y-axis direction. The supporting member 70 has rail members 170 extending in the Y-axis direction. The rail members 170 are respectively fixed to two sidewalls 22 of the chamber 20 having the inner surfaces perpendicular to the X-axis direction. The supporting member 70 has a short-circuit member 270 fastened to a sidewall 22 located at a positive Y-axis side between two sidewalls 22 of the chamber 20 having surfaces perpendicular to the Y-axis direction. FIG. 13 is a cross sectional view illustrating a schematic configuration of the rail member 170. FIG. 14 is a cross sectional view illustrating a schematic configuration of the short-circuit member 270. In FIG. 13 and FIG. 14, illustration of the through holes 69 is omitted.

As shown in FIG. 13, a cross section of the rail member 170 perpendicular to the Y-axis direction is of an L-shape having two flat plate portions. One flat plate portion is in contact with the sidewall 22, and the other flat plate portion is in contact with the rectifying plate 60. The rail member 170 includes a base 171 and a charge diffusion layer 172 formed on a surface of the base 171. By way of example, the base 71 is made of the same material as the base 61, and the charge diffusion layer 172 is made of the same material as the charge diffusion layers 64 and 65. The rail member 170 is fixed to the sidewall 22 by using a metal screw 173. The charge diffusion layer 172 is formed such that at least a portion thereof in contact with the charge diffusion layer 65 and a portion thereof in contact with the metal screw 173 are connected. By grounding the metal screw 173 by connecting it to a ground line, for example, the charge diffusion layer 65 can be grounded via the charge diffusion layer 172. Further, a pipeline 174 included in the supply path 41 may be grounded, and two conductive resins 175 with the pipeline 174 fitted therebetween may be fixed to the rail member 170 by using metal screws 176. In such a case, if the charge diffusion layer 172 is formed to be in contact with the conductive resin 175 or the metal screw 176, the charge diffusion layer 65 can be grounded.

If the charge diffusion layer 64 and the charge diffusion layer 65 are insulated from each other, a relay member 180 in contact with the charge diffusion layer 64 may be used, for example. The relay member 180 includes a base 181 and a charge diffusion layer 182 formed on a surface of the base 181. By way of example, the base 181 is made of the same material as the base 61, and the charge diffusion layer 182 is made of the same material as the charge diffusion layers 64 and 65. The relay member 180 is fixed to the sidewall 22 by using a metal screw 183. The charge diffusion layer 182 is formed such that at least a portion thereof in contact with the charge diffusion layer 64 and a portion thereof in contact with the metal screw 183 are connected. By grinding the metal screw 183 by connecting it to the ground line, for example, the charge diffusion layer 64 can be grounded via the charge diffusion layer 182. The relay member 180 may also be used when the charge diffusion layer 64 and the charge diffusion layer 65 are electrically connected to each other.

As depicted in FIG. 14, a cross section of the short-circuit member 270 perpendicular to the X-axis direction is of a U-shape having three flat plate portions. Two parallel flat plate portions are in contact with the rectifying plate 60, and the other flat plate portion is in contact with the sidewall 22. The short-circuit member 270 includes a base 271 and a charge diffusion layer 272 formed on a surface of the base 271. By way of example, the base 271 is made of the same material as the base 61, and the charge diffusion layer 272 is made of the same material as the charge diffusion layers 64 and 65. The charge diffusion layer 272 is formed such that at least a portion thereof in contact with the charge diffusion layer 64 and a portion thereof in contact with the charge diffusion layer 65 are connected. If the charge diffusion layer 65 is grounded by the rail member 170, the charge diffusion layer 64 is also grounded via the short-circuit member 270. Further, the short-circuit member 270 may be fixed to the sidewall 22 by using a metal screw 273, and by grounding the metal screw 273 by connecting it to the ground line, for example, the charge diffusion layers 64 and 65 may be grounded.

Figure 15:
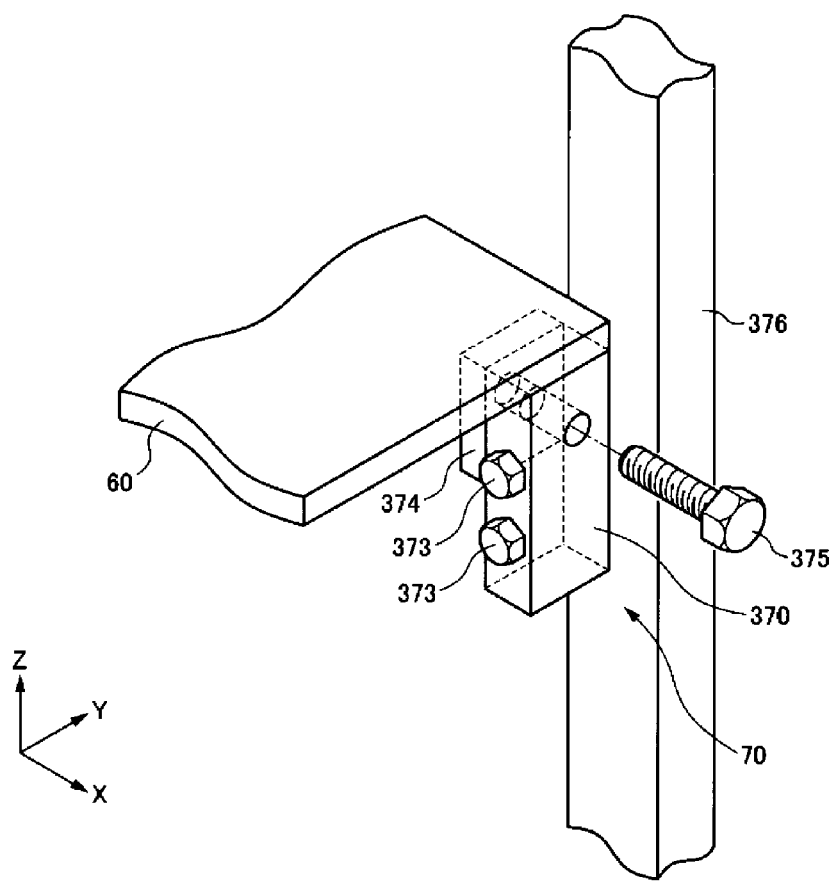
FIG. 15 is a diagram illustrating a schematic configuration of another example supporting member.
Figure 16:
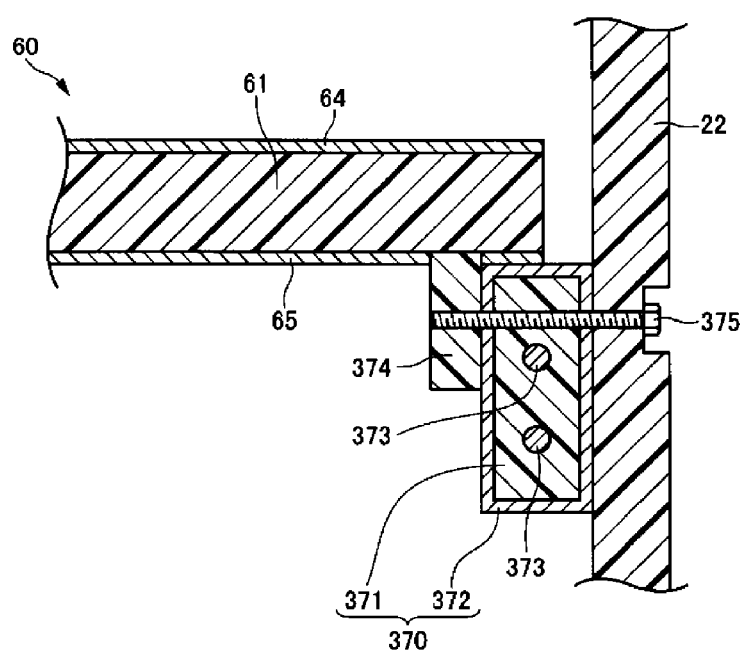
FIG. 16 is a cross sectional view illustrating a schematic configuration of a block.

FIG. 15 is a diagram illustrating a schematic configuration of another example of the supporting member 70. In this case, the rectifying plate 60 is moved toward the positive Y-axis direction when it is installed, and moved toward the negative Y-axis direction when it is separated. That is, the rectifying plate 60 is fitted or separated along the Y-axis direction. A frame 376 extending in the Z-axis direction is provided in the chamber 20, and the supporting member 70 has a block 370 fixed to the frame 376 by using metal screws 373. A connection member 374 is fixed to a bottom surface of the rectifying plate 60. The connection member 374 is fixed to the rectifying plate 60 by, for example, welding. The block 370 and the connection member 374 come into surface contact with each other when the rectifying plate 60 is installed within the chamber 20. The connection member 374 is detachably fixed to the block 370 by using a metal screw 375. As will be described below, the metal screw 375 reaches the connection member 374 through the sidewall 22 and the block 370. FIG. 16 is a cross sectional view illustrating a schematic configuration of the block 370. In FIG. 15 and FIG. 16, illustration of the through holes 69 is omitted.

As shown in FIG. 16, the block 370 includes a base 371 and a charge diffusion layer 372 formed on a surface of the base 371. By way of example, the base 371 is made of the same material as the base 61, and the charge diffusion layer 372 is made of the same material as the charge diffusion layers 64 and 65. The metal screw 375 reaches the connection member 374 through the sidewall 22 and the block 370. The charge diffusion layer 372 is formed such that at least a portion thereof in contact with the charge diffusion layer 65 and a portion thereof in contact with the metal screw 375 are connected. By grounding the metal screw 375 by connecting it to the ground line, for example, the charge diffusion layer 65 can be grounded via the charge diffusion layer 372. The charge diffusion layer 372 may be formed such that at least a portion thereof in contact with the charge diffusion layer 65 and the side surface of the base 61 are connected. By grounding a portion of the charge diffusion layer 372 formed on the side surface of the base 61, the charge diffusion layer 65 can be grounded.

Furthermore, the number of the rectifying plate 60 provided within the chamber 20 may not be particularly limited. By way of non-limiting example, two rectifying plates 60 may be disposed within the chamber 20 while being arranged in the Z-axis direction. In such a case, both the two rectifying plates 60 may be provided with the charge diffusion layer, or the charge diffusion layer may be provided at only the rectifying plate 60 placed at a lower side.

Moreover, the rectifying plate 60 may be applied to not only the etching unit but also, for example, a substrate processing unit such as a film forming unit configured to form a film on the wafer W. The rectifying plate 60 may be applied to a batch type substrate processing unit configured to process a multiple number of wafers W at once as well as a single wafer type substrate processing unit. The rectifying plate 60 may be applied to not only the substrate processing unit but also a part such as the transfer unit 15 where a FFU is provided.

So far, the various exemplary embodiments have been described. However, the exemplary embodiments are not limiting, and various modifications and replacements may be made without departing from the scope of the present disclosure as claimed in the following claims According to the exemplary embodiment, it is possible to shorten a time taken before a stable operation of the substrate processing apparatus is enabled after the rectifying plate is mounted thereto.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a chamber accommodating therein a substrate;
an air supply configured to supply air to the substrate; and
a rectifying member, having multiple through holes, configured to rectify the air supplied from the air supply, wherein the multiple through holes are arranged to have a density and a diameter to adjust a flow velocity of the air supplied from the air supply to the substrate,
wherein the rectifying member comprises:
a base; and
a charge diffusion layer formed on a surface of the base, and
wherein electric charges attached to a surface of the rectifying member are diffused along the charge diffusion layer.

2. The substrate processing apparatus of claim 1, wherein the charge diffusion layer includes a layer made of a conductive material or a static electricity diffusing material.

3. The substrate processing apparatus of claim 2, wherein the charge diffusion layer has a thickness ranging from 0.1 μm to 0.3 μm.

4. The substrate processing apparatus of claim 2, wherein the charge diffusion layer comprises:
a first region having a first charge diffusion property; and
a second region, spaced apart from the substrate farther than the first region when viewed from a top, having a second charge diffusion property which is lower than the first charge diffusion property.

5. The substrate processing apparatus of claim 2, wherein the charge diffusion layer is provided on a top surface and a bottom surface of the base.

6. The substrate processing apparatus of claim 1,
wherein the charge diffusion layer has a thickness ranging from 0.1 μm to 0.3 μm.

7. The substrate processing apparatus of claim 1,
wherein the charge diffusion layer comprises:
a first region having a first charge diffusion property; and
a second region, spaced apart from the substrate farther than the first region when viewed from a top, having a second charge diffusion property which is lower than the first charge diffusion property.

8. The substrate processing apparatus of claim 1,
wherein the charge diffusion layer is provided on a top surface and a bottom surface of the base.

9. The substrate processing apparatus of claim 8,
wherein the charge diffusion layer is further provided on a sidewall surface of the base, and
the charge diffusion layer provided on the top surface and the charge diffusion layer provided on the bottom surface are electrically connected with each other via the charge diffusion layer provided on the sidewall surface.

10. The substrate processing apparatus of claim 8,
wherein the charge diffusion layer is provided on an inner wall surface of each of the multiple through holes, and
the charge diffusion layer provided on the top surface and the charge diffusion layer provided on the bottom surface are electrically connected with each other via the charge diffusion layer provided on the inner wall surface.

11. The substrate processing apparatus of claim 8,
wherein the charge diffusion layer provided on the top surface and the charge diffusion layer provided on the bottom surface are insulated from each other.

12. The substrate processing apparatus of claim 1,
wherein the charge diffusion layer is in an electrically floating state.

13. The substrate processing apparatus of claim 1,
wherein the charge diffusion layer is grounded.

14. The substrate processing apparatus of claim 13, further comprising:
a housing, which is grounded, accommodating the rectifying member therein,
wherein the charge diffusion layer is electrically connected with the housing.

15. The substrate processing apparatus of claim 14, further comprising:
a supporting member electrically connected with the housing and the charge diffusion layer, and configured to support the rectifying member within the housing.

16. The substrate processing apparatus of claim 1, further comprising: an optical sensor provided between the air supply and the rectifying member, and configured to detect a state of the substrate.

* * * * *